(12) United States Patent
Tsai et al.

(10) Patent No.: US 9,279,179 B2
(45) Date of Patent: Mar. 8, 2016

(54) MULTI COIL TARGET DESIGN

(75) Inventors: Ming-Chin Tsai, Hsinchu (TW); Bo-Hung Lin, Kaohsiung (TW); Chung-En Kao, Toufen Township (TW); Chin-Hsiang Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 494 days.

(21) Appl. No.: 13/366,805

(22) Filed: Feb. 6, 2012

(65) Prior Publication Data

US 2013/0199926 A1   Aug. 8, 2013

(51) Int. Cl.
| | |
|---|---|
| *C23C 14/35* | (2006.01) |
| *H05H 1/46* | (2006.01) |
| *H01J 37/32* | (2006.01) |
| *H01J 37/34* | (2006.01) |

(52) U.S. Cl.
CPC ........... *C23C 14/351* (2013.01); *H01J 37/3211* (2013.01); *H01J 37/34* (2013.01); *H05H 1/46* (2013.01); *H05H 2001/4667* (2013.01)

(58) Field of Classification Search
CPC ... H01J 37/3211; H01J 37/34; H01J 37/3438; C23C 14/35; H05H 1/46; H05H 2001/4667
USPC ......... 204/192.12, 298.06, 298.08; 118/723 I, 118/723 AN
See application file for complete search history.

(56) References Cited

U.S. PATENT DOCUMENTS 6,136,165 A * 10/2000 Moslehi .................. 204/298.06
6,146,508 A * 11/2000 Gopalraja et al. ....... 204/298.06
(Continued)

FOREIGN PATENT DOCUMENTS

| EP | 0801413 A1 | 10/1997 |
|---|---|---|
| JP | 2001-035697 | 9/2001 |
| KR | 1020020078618 A | 10/2002 |

OTHER PUBLICATIONS

Setsuhara et al. "Development of internal-antenna-driven large area RF plasma sources using multiple low-inductance antenna units" Surface and Coatings Technology, 174-175, (No Month 2003) 33-39.*

(Continued)

*Primary Examiner* — Rodney McDonald
(74) *Attorney, Agent, or Firm* — Eschweiler & Associates, LLC (57) ABSTRACT

In some embodiments, the present disclosure relates to a plasma processing system configured to form a symmetric plasma distribution around a workpiece. In some embodiments, the plasma processing system comprises a plurality of coils symmetrically positioned around a processing chamber. When a current is provided to the coils, separate magnetic fields, which operate to ionize the target atoms, emanate from the separate coils. The separate magnetic fields operate upon ions within the coils to form a plasma on the interior of the coils. Furthermore, the separate magnetic fields are superimposed upon one another between coils to form a plasma on the exterior of the coils. Therefore, the disclosed plasma processing system can form a plasma that continuously extends along a perimeter of the workpiece with a high degree of uniformity (i.e., without dead spaces).

20 Claims, 5 Drawing Sheets

(56) References Cited

U.S. PATENT DOCUMENTS

| | | | |
|---|---|---|---|
| 6,423,192 B1 * | 7/2002 | Wada et al. | 204/192.12 |
| 7,041,201 B2 * | 5/2006 | Gung et al. | 204/192.12 |
| 8,030,663 B2 * | 10/2011 | Yamazaki et al. | 257/78 |
| 8,668,816 B2 | 3/2014 | Ding et al. | |
| 2003/0116427 A1 | 6/2003 | Ding et al. | |
| 2008/0101978 A1 | 5/2008 | Ryabova et al. | |
| 2010/0304046 A1 | 12/2010 | Miyake et al. | |
| 2011/0233050 A1 | 9/2011 | Leeser et al. | |

OTHER PUBLICATIONS

Setsuhara et al. "Production and Control of Large Area Plasmas for Meters-Scale Flat-Panel-Display Processing with Multiple Low-Inductance Antenna Modules", Plasma Process Polymers No Month 2007, S628-S631.*
Korean Office Action dated Nov. 20, 2013 for Korean Application No. 10-2012-0068502.
Notice of Allowance dated Jun. 2, 2014 in connection with Korean Patent No. 10-2012-0068502, p. 1-3.

* cited by examiner

MULTI COIL TARGET DESIGN

BACKGROUND

Integrated chips are formed by complex fabrication processes, during which a workpiece is subjected to different steps to form one or more semiconductor devices. Some of the processing steps may comprise formation of a thin film onto the semiconductor substrate. Thin films can be deposited onto a semiconductor substrate in a low pressure processing chamber using physical vapor deposition.

Physical vapor deposition is typically performed by acting on a target material to convert the target into a vapor. Often, a target material is acted upon by a plasma comprising a plurality of high energy ions. The high energy ions collide with the target material, dislodging particles into the vapor. The vapor is transported to a semiconductor substrate, upon which the vapor accumulates to form a thin film.

BRIEF DESCRIPTION OF THE DRAWINGS

FIG. 1b illustrates a block diagram of a top view of the physical vapor deposition system of FIG. 1a.

FIG. 1c illustrates a wafer mapping of the thin film thickness resulting from operation of the physical vapor deposition system of FIG. 1a.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Figure 1A:
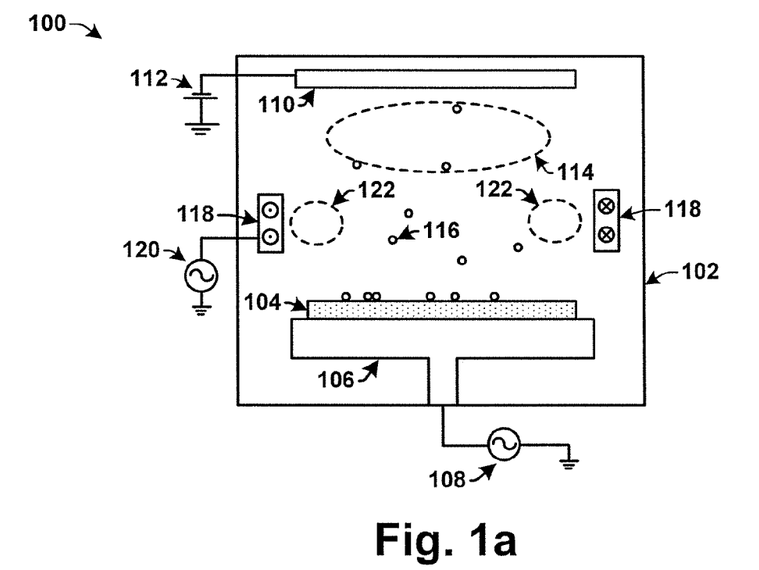
FIG. 1a illustrates a cross-sectional view of a physical vapor deposition system.

FIG. 1a illustrates a cross-sectional view of a physical vapor deposition system 100. The physical vapor deposition system 100 comprises a processing chamber 102 having a workpiece support pedestal 106 configured to hold a semiconductor workpiece 104. A coil 118 is configured around the perimeter of the workpiece 104. The coil 118 is connected to a power generator 120 comprising an RF power generator operating at an RF frequency (e.g., 13.56 MHz) or a DC power generator. The coil 118 is configured to generate an electric or/and magnetic field that transfers energy from the power generator 120 to gas particles within the processing chamber 102 to form a plasma 114. A target 110, located at the top of the processing chamber 102, is coupled to a high voltage D.C. source 112 configured to apply a bias to the target 110 that causes high energy ions from the plasma 114 to sputter the target 110 and generate target atoms 116. The target atoms 116 are ionized by the coil 118 to generate plasma 122 having ionized target atoms. The ionized target atoms are attracted to the workpiece 104, upon which they condense to form a thin film, by the magnetic field generated by the coil 118 and by a bias applied to the workpiece 104 by an RF plasma bias power generator 108 coupled to the workpiece support pedestal 106.

Figure 1B:
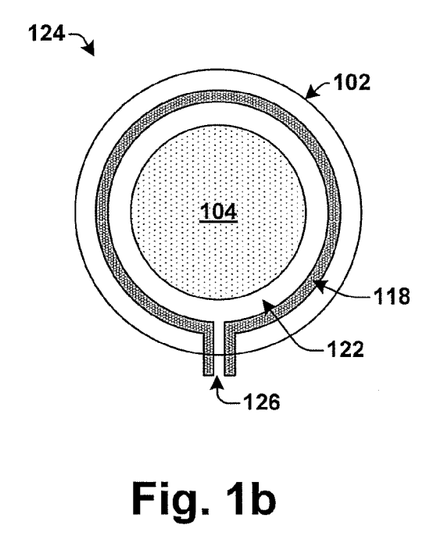
Figure 1C:
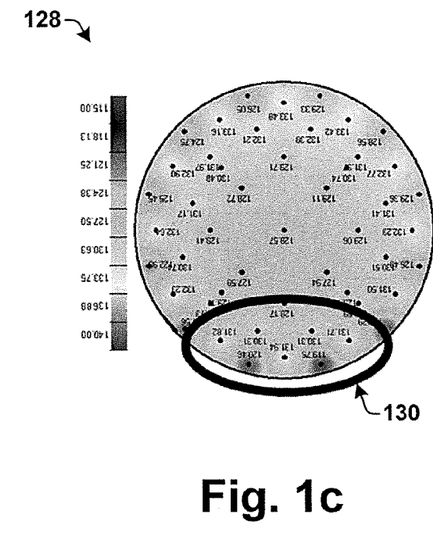

As illustrated in top view 124 of FIG. 1b, the coil 118 extends around the perimeter of the workpiece 104. However, to prevent shorts, the coil 118 has an open design with a break 126 in the coil ring. The open design causes non-uniformities in the plasma distribution which cause bad thin film thickness uniformity. For example, as shown in the wafer mapping 128 of FIG. 1c, the region 130 of the workpiece, which is in close proximity to the break 126 in the coil ring, has a reduced film thickness (e.g., a film thickness of approximately 115 Å on a wafer having a film thickness of approximately 127 Å). Furthermore, as workpiece sizes increase the influence of the electric or/and magnetic field generated by the coil 118 on the workpiece will decrease.

Accordingly, the present disclosure relates to a plasma processing system configured to form a plasma that continuously extends along a perimeter of a workpiece in a uniform manner. In some embodiments, the disclosed plasma processing system comprises a plurality of coils symmetrically positioned around a processing chamber. When a current is provided to the coils, separate electric or/and magnetic fields, which operate to ionize the target atoms, emanate from the separate coils. The separate electric or/and magnetic fields operate upon ions within the coils to form a plasma on the interior of the coils. Furthermore, the separate electric or/and magnetic fields are superimposed upon one another between coils to form a plasma on the exterior of the coils. Therefore, the disclosed plasma processing system can form a plasma that continuously extends along a perimeter of the workpiece with a high degree of uniformity (i.e., without dead spaces).

Figure 2A:
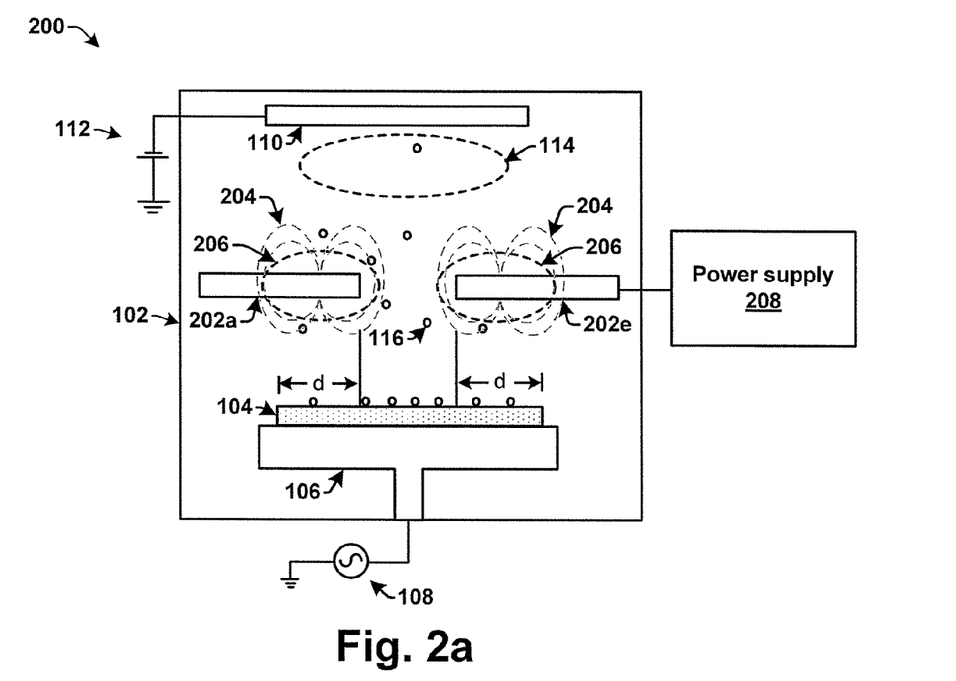
FIG. 2a illustrates a cross-sectional view of some embodiments of a physical vapor deposition system comprising multiple coils positioned around a center of a workpiece.

FIG. 2a illustrates a cross-sectional view of some embodiments of a physical vapor deposition system 200 comprising a plurality of coils 202 positioned around a center of a workpiece 104.

The plurality of coils 202 are connected to a power supply 208 that is configured to provide one or more signals to the plurality of coils 202. For example, in various embodiments, the power supply 208 may provide an RF signal having a frequency of 13.56 MHz or a DC signal to the coils 202. The coils 202 are configured to independently generate electric or/and magnetic fields 204 based upon the received signals. The electric or/and magnetic fields 204 transfer energy from the power supply 208 to the target atoms 116. When a sufficient amount of energy has been transferred, a plasma 206 comprising ionized target ions is formed.

The plurality of coils 202 comprise electromagnetic elements having a conductive material in a loop shape. When current is run through the loop shape of the conductive material, the electric or/and magnetic fields 204 are generated along the axes of the coils 202. In some embodiments, the coils 202 comprise windings of an electrically conducting wire. However, it will be appreciated that the term "coils", is not limited to coils comprising a plurality of windings of electrical wire, but instead is intended to encompass any electromagnetic element (i.e., an element that generates an electric and/or magnetic field when a current is passed through it) having a loop or coil shape. Furthermore, the loop or coil shape may comprise circular shapes or other similar shapes such as toroid shapes, octagonal shapes, etc.

The coils 202 are located at positions between the target 110 and the workpiece 104. Such a position allows for the coils 202 to be surrounded by target atoms 116 on both the interior and exterior to the coils 202, so that plasma containing ionized target atoms can be formed at the inside of coils and between coils. For example, the electric or/and magnetic field 204 within a coil 202 operates to ionize target atoms 116 on the interior of a coil 202 to form a plasma within the coil. Furthermore, the electric or/and magnetic fields 204 between adjacent coils operate to ionize target atoms 116 external to the coils 202 to form a plasma between the adjacent coils. This provides for a plasma 206 that continuously extends along the perimeter of the workpiece 104.

Figure 2B:
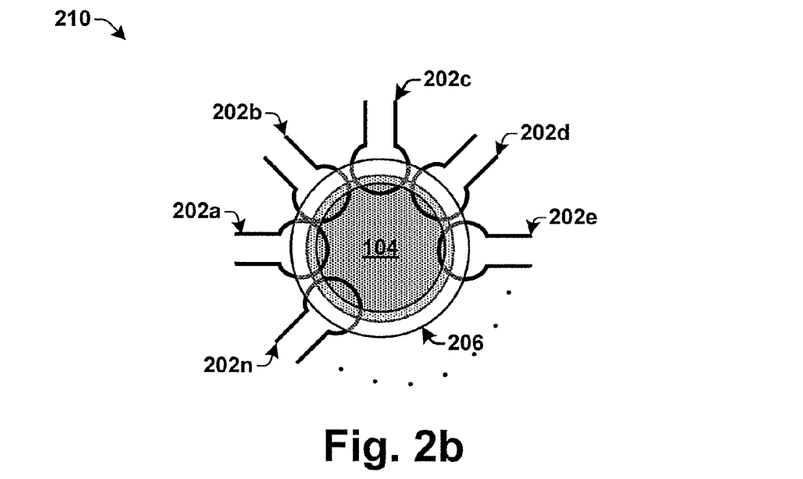
FIG. 2b illustrates a top view of some embodiments of a physical vapor deposition system comprising multiple coils configured around a center of a workpiece.

FIG. 2b illustrates a top view 210 of some embodiments of an array of coils positioned around a center of a workpiece 104.

As illustrated in FIG. 2b, in some embodiments, the plurality of coils 202 are positioned symmetrically around the center of the workpiece 104. Such symmetrically positioned coils may comprise coherent coils configured to generate electric or/and magnetic fields having a same polarity so that the separate magnetic fields constructively interfere with one another. Symmetrically positioning the coherent coils allows for the formation of a plasma that is uniform and that continuously extends along the perimeter of the workpiece 104 without dead spaces (i.e., spaces of low field strength). This is because by generating electric or/and magnetic fields that constructively interfere with one another, the electric or/and magnetic field strength between adjacent coils can be operated to form an electric or/and magnetic field strength that is substantially uniform with the magnetic field formed within the interior of a coil.

In some embodiments, the plurality of coils 202 have axes perpendicular to the plane of the workpiece 104. The coils 202 are located at distinct angular positions around a center of the workpiece 104. For example, a first coil 202a is positioned at a first angular position, while a second coil 202b is positioned at a second, different angular position. The number of coherent coils 202 positioned around the workpiece 104 may vary in different embodiments. By increasing the number of coherent coils 202 the uniformity of the electric or/and magnetic field generated by the plurality of coils can be increased, providing for improved plasma uniformity.

In some embodiments, the coils are configured to extend within the outer perimeter of the workpiece 104. As shown in FIG. 2a, the coils 202 are configured to extend to a distance d within the outer perimeter of the workpiece 104. By extending to a position above the workpiece 104, the interior and exterior of the coil 202 are subjected to target atoms 116, allowing the coils 202 to form the plasma 206 that continuously extends along the perimeter of the workpiece 104 (e.g., plasma is formed inside the coils and in the space between coils). Furthermore, extending the coils 202 within the outer perimeter of the workpiece 104 allows for the electric or/and magnetic field strength to be invariant with respect to the maximum size of the workpiece. For example, by increasing the distance that the coils 202 are extended above the workpiece 104, the electric or/and magnetic field strength generated by the coils can be increased even as workpiece size is enlarged (e.g., to 450 mm workpieces).

Figure 3:
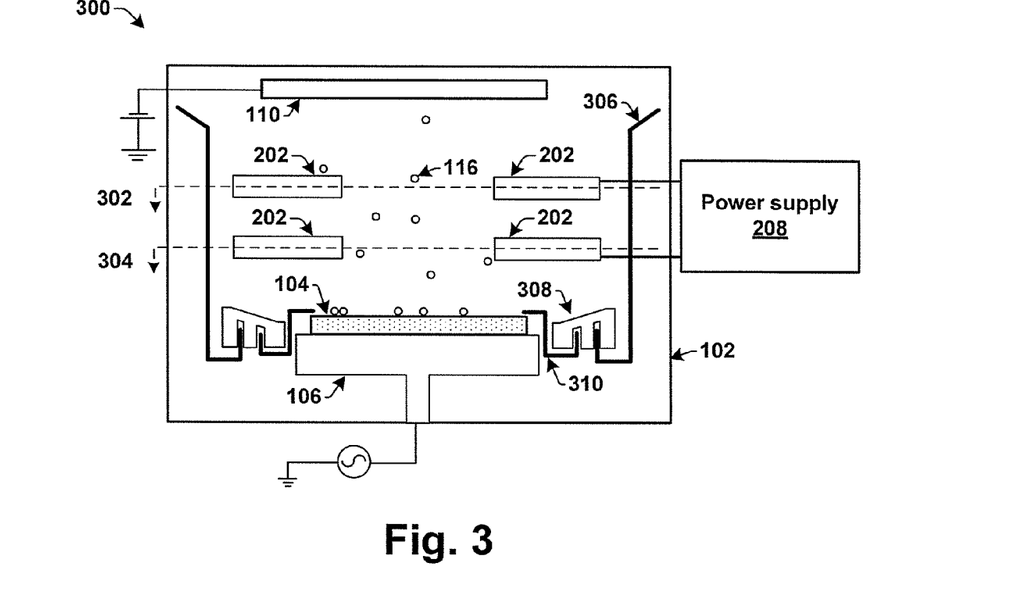
FIG. 3 illustrates a cross-sectional view of a physical vapor deposition system having a plurality of coils located between a target and a workpiece.

FIG. 3 illustrates of a cross-sectional view of some additional embodiments of a physical vapor deposition system 300.

As shown in FIG. 3, in some embodiments the disclosed physical vapor deposition system 300 may comprise a Faraday shield 306 located between the plasma and the sidewalls of the processing chamber 102. The Faraday shield 306 is configured to prevent target atoms from depositing on the sidewalls. In some embodiments, the disclosed coils 202 are located inside of the Faraday shield 306 (i.e., at an opposite side of the Faraday shield 306 as the sidewalls). In additional embodiments, the processing chamber 102 may further comprise a cover ring 308, and a deposition ring 310 disposed over a portion of the pedestal 106. During processing the cover ring 308 and deposition ring 310 confine plasma to a region of the processing chamber that is above the workpiece 104.

In some embodiments, one or more of the plurality of coils 202 are positioned on a first horizontal plane 302 that is parallel to the plane of the workpiece 104. Placement of the one or more of the plurality of coils 202 on a first horizontal plane 302 allows for cancellation of angular components within the electric or/and magnetic field between coils to form a uniform electric or/and magnetic field around the workpiece 104. In other embodiments, the plurality of coils 202 are positioned at different heights relative to the workpiece 104.

In some embodiments, coils are positioned vertically above one another. For example, one or more of the plurality of coils 202 are positioned on the first horizontal plane 302, while one or more of the plurality of coils 202 are positioned on a second horizontal plane 304. The second horizontal plane 304 is parallel to and vertically above the first horizontal plane 302. Placement of multiple coils vertically above one another allows for the coils to act upon charged particles with a force that pulls the charged particles down to the workpiece 104. This can be used to improve wafer edge step-coverage and reduce thin film deposition asymmetry.

Figure 4A:
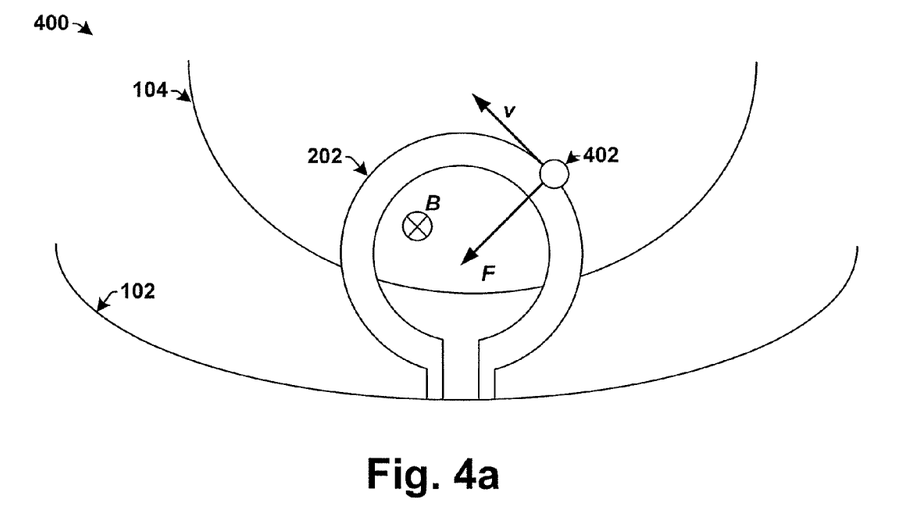
FIG. 4a illustrates a top view of some embodiments of a coil showing forces operating upon ions within a processing chamber.

FIG. 4a illustrates a top view 400 of some embodiments of a coil 202 showing forces operating upon ions within a processing chamber 102 due to a magnetic field. It will be appreciated that the forces shown in FIG. 4a are not limiting to the forces generated by the coil 202 and that other and/or additional forces may act upon ions due to an electric field generated by the coils 202, for example.

The coil 202 is configured to carry a current, such that when a current is passed through the coil 202 a magnetic field B is generated perpendicular to the plane of the coil 202. The magnetic field B causes a force F to act upon a charged particle 402 traveling with a velocity of v. The force F pushes the charged particle 402 in a direction that is perpendicular to both the direction of the magnetic field B and the direction of the particle's velocity v (e.g., F=qvxB, where q is the particle's charge, v is the velocity of the particle, B is the magnetic field, and x is the cross product).

Figure 4B:
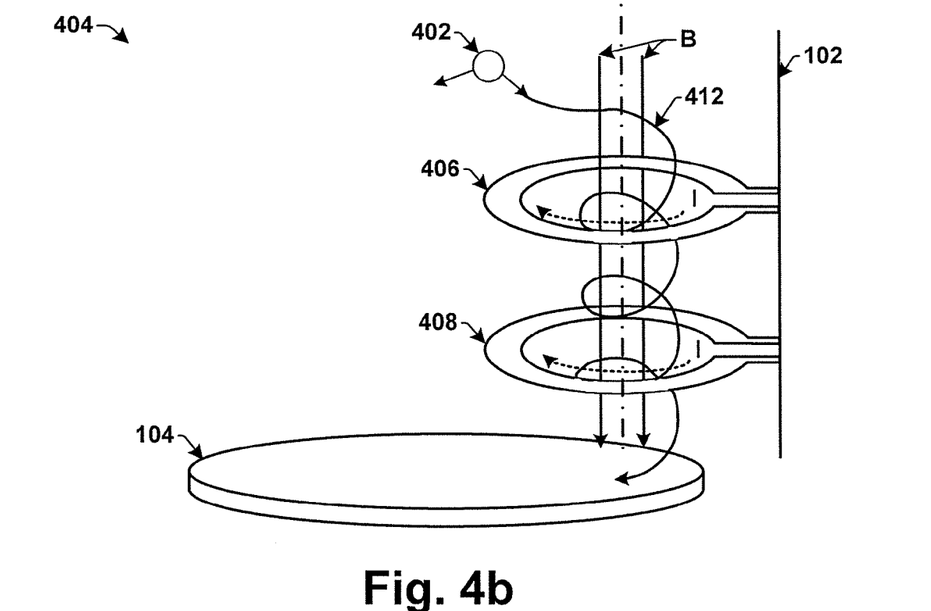
FIG. 4b illustrates a side view of some embodiments of disclosed coils showing ion motion within the coils.

As an ionized particle travels from a target towards a workpiece, forces on the particle due to the magnetic field can be adjusted to vary the position at which the particles come into contact with the workpiece 104. For example, FIG. 4b illustrates a side view 404 of some embodiments of a plasma processing system comprising two vertically stacked coils, 406 and 408.

The vertically stacked coils 406 and 408 are positioned to generate magnetic fields B that can pull down an ionized particle 402 to improve wafer edge step-coverage and asymmetry. For example, the vertically stacked coils, 406 and 408, are aligned along a common vertical axis 410 that intersects an edge of workpiece 104. The magnetic fields B generated by the vertically stacked coils, 406 and 408, are substantially parallel to the common vertical axis 410 and in the direction of the workpiece. The magnetic field B operates upon a charged particle 402 with a force F that changes the trajectory of the charged particle 402. The charged particle 402 continues towards the workpiece 104, but begins to undergo cyclotron motion. The cyclotron motion confines the motion of the charged particle 402, effectively causing the charged particle 402 to be pulled downward towards the workpiece 104 at a position corresponding to the coils 406 and 408. The use of a plurality of vertically stacked coils confines the charged particle 402 along an extended height of the processing chamber 102 until it is deposited onto the surface of the workpiece 104 along the wafer edge.

In various embodiments, the separate coils, located at different positions around a processing chamber, can be controlled by different control signals. The use of different control signals allows for particle trajectories, and therefore the rate of thin film deposition, to be adjusted along some parts of a wafer edge without being adjusted along other parts of the wafer edge. For example, this is achieved by operating some coils to pull down charged target ions while not operating other coils to pull down charged target ions.

Figure 5:
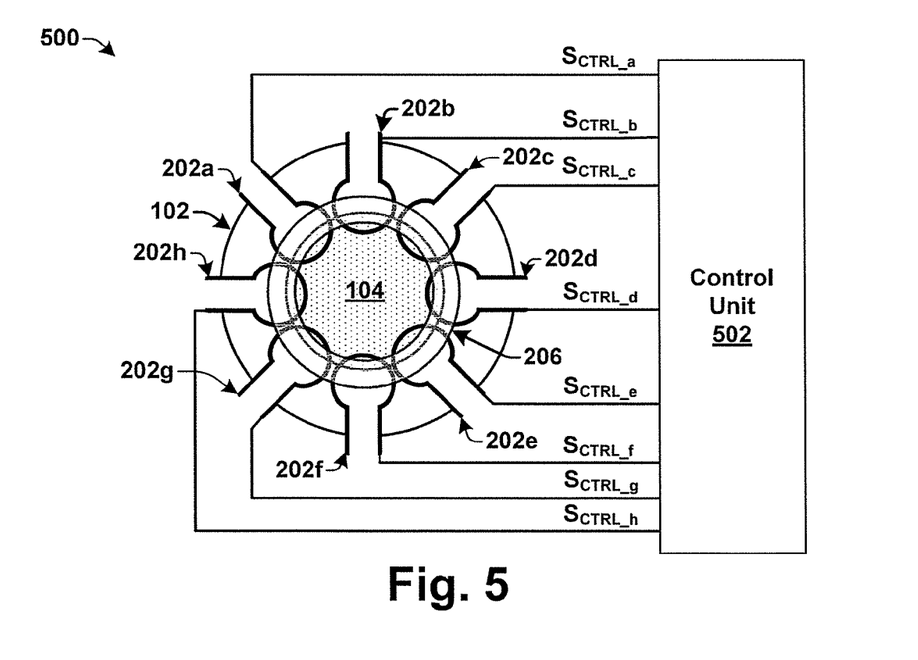
FIG. 5 illustrates a top view of some embodiments of an array of coils configured to receive a common control signal.

FIG. 5 illustrates a top view 500 of some embodiments of an array of coils 202a, . . . , 202h configured to receive separate control signals $S_{CTRL\_a}, \ldots, S_{CTRL\_h}$.

As illustrated in FIG. 5 a plurality of coils 202a . . . 202h are connected to a control unit 502 by separate conductive paths. The control unit 502 is configured to provide separate control signal $S_{CTRL\_a}, \ldots, S_{CTRL\_h}$ to each of the coils 202a . . . 202h, so that each coils can be operated independent of one another. The independent operation allows for the control unit 502 to tune an overall electric or/and magnetic field (i.e., comprising a superposition of the separate electric and/or magnetic fields) to adjust distribution of plasma 206 and therefore the deposited film thickness along an outer edge of the workpiece 104.

For example, the separate control signals $S_{CTRL\_a}, \ldots, S_{CTRL\_h}$ allow for the separate coils 202a, . . . , 202h to be operated to receive a control signal with a same value or with different values. If different values are provided to the coils 202a, . . . , 202h an overall magnetic field comprising a continuous asymmetric magnetic field can be generated. By controlling the asymmetry of the overall magnetic field, the distribution of plasma 206 and the trajectory of ionized target atoms are controlled. Therefore, by selectively adjusting the separate control signals $S_{CTRL\_a}, \ldots, S_{CTRL\_h}$ the control unit 502 can achieve a tuning of thin film deposition onto the workpiece 104.

In various embodiments, the separate control signals $S_{CTRL\_a}, \ldots, S_{CTRL\_h}$ may comprise different coil turn-on timing and/or different power levels. For example, in some embodiments, the separate control signal $S_{CTRL\_a}, \ldots, S_{CTRL\_h}$ comprise currents having varying current values. By providing equal current values to each of the coils 202a, . . . , 202h, a symmetric magnetic field is generated within the processing chamber 102. However, by providing a first current $I_1$ to a first coil 202a and a second current $I_2 > I_2$ to a second coil 202b, the overall magnetic field is changed. This is because the magnetic field contribution of the second coil 202b is greater than that of the first coil 202a, resulting in an asymmetric magnetic field within the processing chamber 102.

In alternative embodiments, the separate coils can be controlled by the same control signals. For example, FIG. 6 illustrates a top view 600 of some embodiments of an array of coils 202a, . . . , 202h configured to share a common control signal $S_{CTRL}$.

Figure 6:
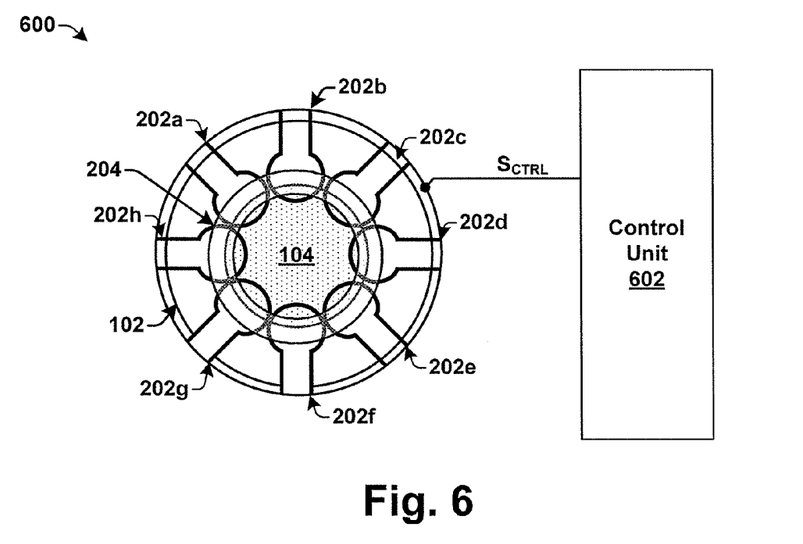
FIG. 6 illustrates a top view of some embodiments of an array of coils configured to receive a common control signal.

As illustrated in FIG. 6, a plurality of coils 202a, . . . , 202h are connected to a control unit 602 at a single input node. The control unit is configured output a common control signal $S_{CTRL}$, which is provided to each of the coils 202a, . . . , 202h. The common control signal $S_{CTRL}$ operates each of the coils 202a, . . . , 202h to generate an electric or/and magnetic field having a homogenous field strength (assuming that all the coils have a same resistance) along the perimeter of the workpiece 104. In some embodiments, the common control signal $S_{CTRL}$ comprises a current.

Figure 7:
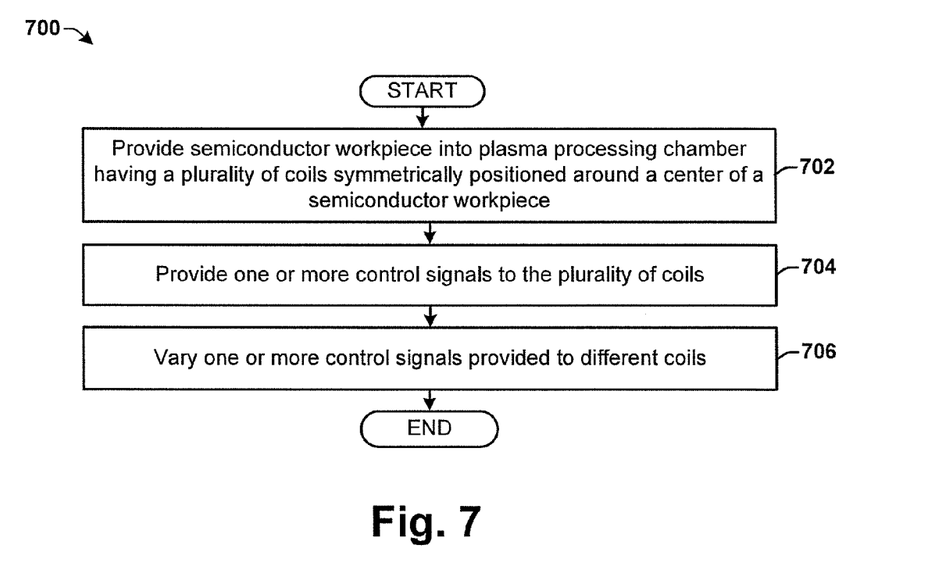
FIG. 7 illustrates a flow diagram of some embodiments of a method for forming an electric or/and magnetic field that continuously extends along a perimeter of a semiconductor workpiece in a plasma processing system.

FIG. 7 illustrates a flow diagram of some embodiments of a method 700 for forming an electric or/and magnetic field that continuously extends along a perimeter of a semiconductor workpiece in a plasma processing system. While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 702 a semiconductor workpiece is provided into a plasma processing chamber having a plurality of coils symmetrically positioned around a center of the semiconductor workpiece. In some embodiments, the plurality of the coils are configured to extend inward from a perimeter of the semiconductor workpiece to a position between a target and the semiconductor workpiece.

At step 704 one or more control signal are provided to the plurality of coils. The flow of current through the plurality of coils generates separate electric or/and magnetic fields that emanate from different positions around the workpiece. The separate electric or/and magnetic fields continuously extend along the perimeter of the workpiece. The symmetrical positioning of the coils allows for the separate electric or/and magnetic fields to achieve a uniform plasma distribution.

At step 706 the one or more control signals provided to different coils are varied. By varying the control signals provided to different coils, the distribution of the electric or/and magnetic field within the processing chamber can be changed to tune plasma processing.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein Therefore, the present disclosure relates to a plasma processing system that can form a plasma that continuously extends along a perimeter of a workpiece in a uniform manner.

In some embodiments, the present disclosure relates to a plasma processing system, comprising a processing chamber configured to house a semiconductor workpiece. A plurality of coils are symmetrically positioned around a center of the semiconductor workpiece. A power supply is configured to provide one or more control signals to the plurality of coils that cause the coils to independently form separate electric fields or magnetic fields that continuously extends along a perimeter of the semiconductor workpiece and that form a plasma within the processing chamber.

In another embodiment, the present disclosure relates to a physical vapor deposition system comprising a processing chamber configured to house a semiconductor workpiece. A target is configured to provide target atoms to the processing chamber. A plurality of coils are configured to generate separate electric fields or magnetic fields that operate upon the target atoms to form a plasma on an interior of the plurality of coils and which are superimposed upon one another to form a plasma on an exterior of the plurality of coils that is substantially uniform to the plasma formed interior of the coils.

In another embodiment, the present disclosure relates to a method of forming a continuous electric or magnetic field that continuously extends along a perimeter of a semiconductor workpiece in a plasma processing system. The method comprises providing a semiconductor workpiece into a plasma processing system having a plurality of coils symmetrically positioned around a center of a semiconductor workpiece. The method further comprises providing a control signal to the plurality of coils, wherein the control signal causes the coils to generate separate electric fields or magnetic fields that emanate from different positions around the semiconductor workpiece and that continuously extend along a perimeter of the semiconductor workpiece. The separate electric fields or magnetic fields transfer power to particles within the processing chamber to form a plasma.

What is claimed is:

1. A plasma processing system, comprising:
a processing chamber comprising a pedestal configured to hold a semiconductor workpiece;
a plurality of coils having axes that are substantially perpendicular to an upper surface of the pedestal and that are located at positions laterally between a center of the pedestal and a sidewall of the processing chamber;
a power supply configured to provide one or more control signals to the plurality of coils that cause the plurality of coils to independently form separate electric fields or magnetic fields;
wherein the plurality of coils respectively comprise a first straight segment, a second straight segment parallel to the first straight segment, and a curved arc measuring greater than 180°, wherein the curved arc is connected between the first straight segment and the second straight segment and overlies a perimeter of the pedestal; and
wherein the first straight segment and the second straight segment extend through the sidewall of the processing chamber at a location that is laterally outside the perimeter of the pedestal.

2. The plasma processing system of claim 1, wherein the curved arc extends to an inner position vertically disposed between a target and the pedestal.

3. The plasma processing system of claim 1, wherein at least two of the plurality of coils comprise a bottom coil and a top coil vertically stacked above one another so that the bottom coil and the top coil wrap around an axis extending through a center of the bottom coil and through a center of the top coil in a direction perpendicular to chords of the bottom coil and the to coil.

4. The plasma processing system of claim 1, wherein the plurality of coils are arranged radially about a central axis of the pedestal at radial angles equally spaced from one another, and wherein the plurality of coils collectively generate a uniform magnetic field that continuously extends around the perimeter without a discontinuity.

5. The plasma processing system of claim 1, wherein the plurality of coils respectively have diameters smaller than the semiconductor workpiece.

6. The plasma processing system of claim 1, wherein the plurality of coils respectively comprise a plurality of turns.

7. The plasma processing system of claim 1,
wherein the plurality of coils are evenly spaced apart from one another in a circular pattern overlying an outer perimeter of the pedestal; and
wherein all of the plurality of coils are separated from two adjacent ones of the plurality of coils by a same distance.

8. The plasma processing system of claim 1, wherein the first straight segment and the second straight segment of all of the plurality of coils are bisected by lines that also extend through a point overlying the center of the pedestal.

9. The plasma processing system of claim 8, wherein the lines bisecting the first straight segment and the second straight segment of the plurality of coils are separated by an angle that is equal to 360° divided by a number of the plurality of coils.

10. The plasma processing system of claim 1, wherein all of the plurality of coils are separated from the center of the pedestal by an equal radial distance.

11. The plasma processing system of claim 1, wherein the first straight segment, the second straight segment, and the curved arc are located along a plane that is parallel to an upper surface of the pedestal.

12. A physical vapor deposition system, comprising:
a processing chamber configured to house a semiconductor workpiece within a semiconductor workpiece location having a curved outer perimeter on a pedestal;
a target configured to provide a metal or a metal alloy to the processing chamber;
a plurality of coils having a plurality of axes that are substantially perpendicular to an upper surface of the pedestal, wherein the plurality of coils extend within the processing chamber from outer positions surrounding the pedestal to inner positions overlying the pedestal; and
wherein the plurality of coils are arranged radially about a central axes of the pedestal so that all of the plurality of coils are spaced at equal radial angles from one another in a circular pattern overlying an outer perimeter of the semiconductor workpiece location, and wherein all of the plurality of coils are separated from two adjacent ones of the plurality of coils by a same distance.

13. The physical vapor deposition system of claim 12
wherein the plurality of coils respectively comprise first and second straight segments spaced apart from one another laterally by a first distance, and a curved arc measuring greater than 180° and having a diameter greater than the first distance; and
wherein the plurality of coils are configured to extend from outer positions outside a perimeter of the pedestal to inner positions, which vertically overlie the pedestal and that are laterally disposed between the perimeter and a center of the pedestal.

14. The physical vapor deposition system of claim 12, further comprising:
   a control unit configured to provide one or more control signals to the plurality of coils which control generation of separate magnetic fields; and
   wherein the plurality of coils are arranged in a configuration that collectively generates a uniform magnetic field that extends around the outer perimeter without a discontinuity.

15. The physical vapor deposition system of claim 14, wherein the control unit is configured to provide a common control signal to each of the plurality of coils.

16. The physical vapor deposition system of claim 12, further comprising:
   a cover ring surrounding the pedestal and having a lower surface that is below an upper surface of the pedestal;
   a deposition ring laterally extending from below the cover ring to a location that terminates over a portion of the pedestal and below the plurality of coils; and
   a faraday shield extending from below the cover ring to a location that terminates over the plurality of coils.

17. The physical vapor deposition system of claim 12,
   wherein a bottom coil comprising one or more of the plurality of coils is positioned on a first horizontal plane parallel to an upper surface of the pedestal;
   wherein a top coil comprising one or more of the plurality of coils is positioned on a second horizontal plane vertically above and parallel to the first horizontal plane; and
   wherein the bottom coil and the to coil wrap around an axis extending through a center of the bottom coil and through a center of the to coil in a direction perpendicular to chords of the bottom coil and the top coil.

18. A method of forming a continuous electric or magnetic field that continuously extends along a perimeter of a semiconductor workpiece in a plasma processing system, comprising:
   providing a semiconductor workpiece on a pedestal within a processing chamber of a plasma processing system having a plurality of coils having axes that are substantially perpendicular to a plane of the semiconductor workpiece and that extend inward from outer positions outside a perimeter of the semiconductor workpiece to inner positions, which are vertically overlying the pedestal and that are laterally arranged between the perimeter of the pedestal and a center of the pedestal; and
   providing a control signal to the plurality of coils, wherein the control signal causes the plurality of coils to generate separate magnetic fields that emanate from different positions around the semiconductor workpiece and that form a uniform magnetic field that continuously extends along a perimeter of the semiconductor workpiece without a discontinuity.

19. The method of claim 18, wherein the inner positions are vertically disposed between a target and the pedestal.

20. The method of claim 18, further comprising:
   sending current through the plurality of coils in a direction that generates the separate magnetic fields to cause ions within the plasma to undergo cyclotron motion, which pulls the ions down towards the pedestal.

* * * * *